United States Patent
Shin et al.

(10) Patent No.: US 7,558,311 B2
(45) Date of Patent: Jul. 7, 2009

(54) SPREAD SPECTRUM CLOCK GENERATOR AND METHOD FOR GENERATING A SPREAD SPECTRUM CLOCK SIGNAL

(75) Inventors: Jong-shin Shin, Seoul (KR); Duck-hyun Chang, Yonin-si (KR); Ji-young Kim, Osan-si (KR); Myoung-bo Kwak, Seoul (KR); Il-won Seo, Yongin-si (KR); Jae-Hyun Park, Seoul (KR); Hyun-goo Kim, Seoul (KR); Chi-won Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 720 days.

(21) Appl. No.: 11/205,014

(22) Filed: Aug. 17, 2005

(65) Prior Publication Data

US 2006/0098714 A1     May 11, 2006

(30) Foreign Application Priority Data

Nov. 8, 2004     (KR) ..................... 10-2004-0090445

(51) Int. Cl.
    *H04B 1/00*     (2006.01)
(52) U.S. Cl. ..................................... 375/130
(58) Field of Classification Search ................. 375/130, 375/371–376; 327/146–148, 150, 155–157, 327/162
    See application file for complete search history.

(56) References Cited

U.S. PATENT DOCUMENTS

| | | | |
|---|---|---|---|
| 5,872,807 A * | 2/1999 | Booth et al. ................ | 375/130 |
| 5,943,382 A | 8/1999 | Li et al. | |
| 6,046,646 A | 4/2000 | Lo et al. | |
| 6,294,936 B1 | 9/2001 | Clementi | |
| 7,406,144 B2 * | 7/2008 | Wang ......................... | 375/376 |
| 7,412,019 B2 * | 8/2008 | Kuo ............................ | 375/373 |
| 2003/0039330 A1 | 2/2003 | Castiglione et al. | |

FOREIGN PATENT DOCUMENTS

| | | |
|---|---|---|
| KR | 2003-0026211 | 3/2003 |
| TW | 200407692 | 5/2004 |
| TW | 200421712 | 10/2004 |

OTHER PUBLICATIONS

Office Action for corresponding Taiwanese Application No. 094136499 dated Jun. 13, 2008 and translation thereof.
Taiwanese Search Report dated May 12, 2008.

* cited by examiner

*Primary Examiner*—David C Payne
*Assistant Examiner*—Rahel Guarino
(74) *Attorney, Agent, or Firm*—Harness, Dickey & Pierce (57) ABSTRACT

A spread spectrum clock generator (SSCG) and method of generating a spread spectrum clock (SSC) signal, in which the SSCG may include a controller outputting a given modulation voltage signal based on a difference between an average frequency of a first feedback signal and a comparison frequency signal input thereto, or based on comparison in total phase variations between a second feedback signal and the comparison frequency signal, and a sub-system for generating a first control voltage as a function of an input reference frequency signal and a second feedback signal input thereto. An adder may add the first control voltage signal and the modulation voltage signal to generate a second control voltage signal, and a voltage control oscillator (VCO) may generate the SSC signal based on the second control voltage signal.

60 Claims, 7 Drawing Sheets

SPREAD SPECTRUM CLOCK GENERATOR AND METHOD FOR GENERATING A SPREAD SPECTRUM CLOCK SIGNAL

PRIORITY STATEMENT

This application claims the benefit of Korean Patent Application No. 10-2004-0090445, filed on Nov. 8, 2004, in the Korean Intellectual Property Office, the disclosure of which is incorporated herein in its entirety by reference.

BACKGROUND OF THE INVENTION

1. Field of the Invention

The present invention relates in general to a spread spectrum clock generator, phased-lock loop arrangement of an SSCG, a method of generating a spread spectrum clock signal and a modulation controller of a SSCG.

2. Description of the Related Art

A phase locked-loop (PLL) may be an indispensable circuit in digital systems. Technology developments have led to high-speed, highly integrated digital systems and PLLs, which in one respect may be the source or cause of electromagnetic interference (EMI). If a high frequency signal has energy exceeding a given reference value, EMI occurs and may cause malfunction of peripheral electronic circuits, for example, semiconductor integrated circuits.

However, a spread spectrum clock generator (SSCG) may be used to reduce EMI. In general in a SSCG, a reference signal having substantial energy, e.g., power, at a specific frequency may be modulated into a spread spectrum clock (SSC) signal having a given bandwidth and energy at a frequency less than that of the reference signal. For example, if the frequency of the reference signal is 1 MHz, the reference signal may be modulated into a signal having a frequency band of 0.99 MHz to 1.01 MHz in a given repetition cycle.

The clock frequency of the PLL is not fixed to a reference frequency and may vary in given range of frequencies. As a result, EMI may be avoided by dispersing energy of the specific frequency, resulting in a signal having lower energy spread or a lower range of frequencies. The SSCG thus modulates the clock frequency of the PLL in a relatively small range, thereby reducing the power margin and hence EMI.

Figure 1A:
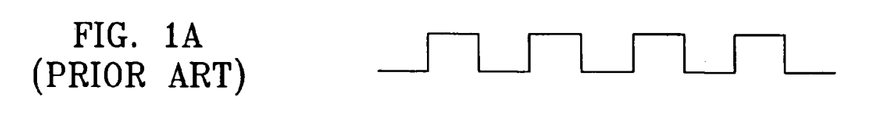
FIGS. 1A through 1F are graphs illustrating reference frequency variations of a prior art PLL output signal and a PLL output signal generated by a prior art spread spectrum clock generator (SSCG).
Figure 1B:
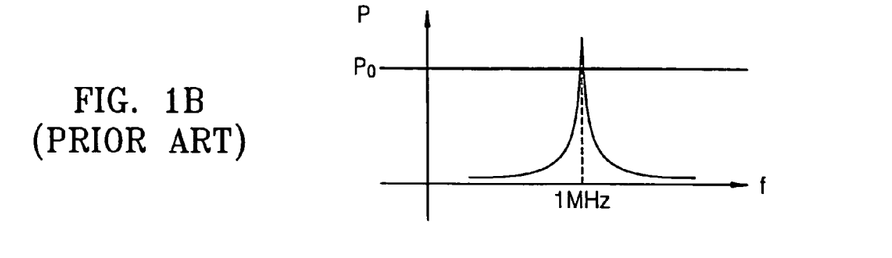
Figure 1C:
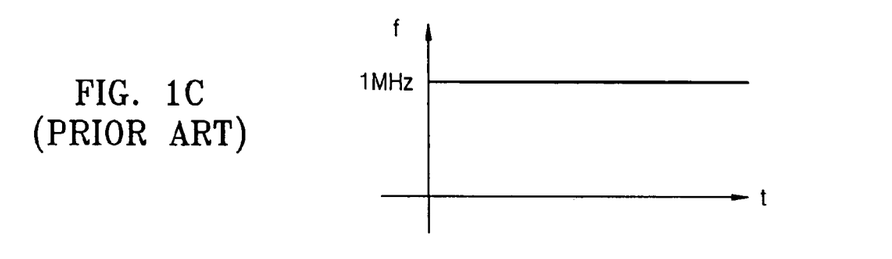
Figure 1D:
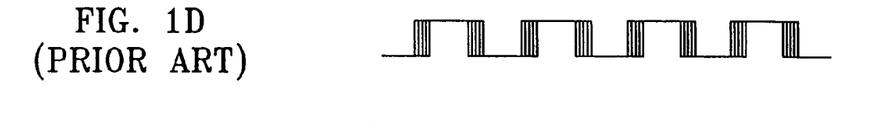
Figure 1E:
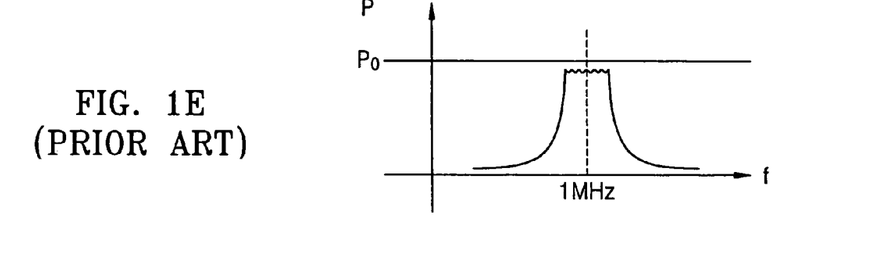
Figure 1F:
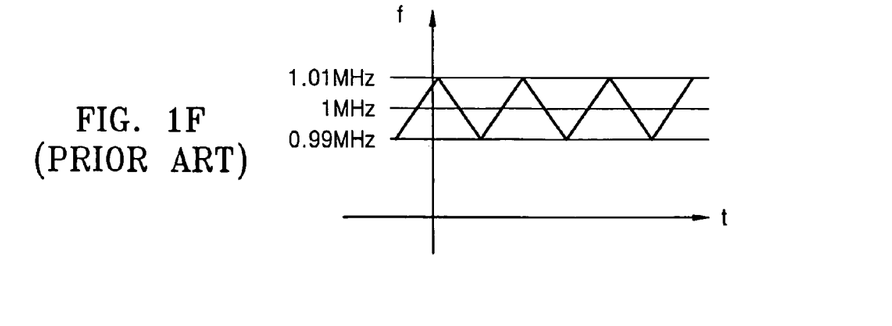

FIGS. 1A through 1F are graphs illustrating reference frequency variations of a prior art PLL output signal and a PLL output signal generated by a prior art spread spectrum clock generator (SSCG). FIGS. 1A-1C are directed to signals formed where a SSCG is not used, whereas FIGS. 1D-1F are directed to signals where an SSCG is used.

The graph of FIG. 1A illustrates a clock signal having a constant frequency without using the SSCG and the graph of FIG. 1B shows a frequency spectrum having an energy of the reference frequency (1 MHz of FIG. 1) which is over a given threshold energy P0 that generates EMI. FIG. 1C is a graph illustrating temporal frequency variation of the PLL output signal, which as shown has a constant reference frequency.

Figure 2:
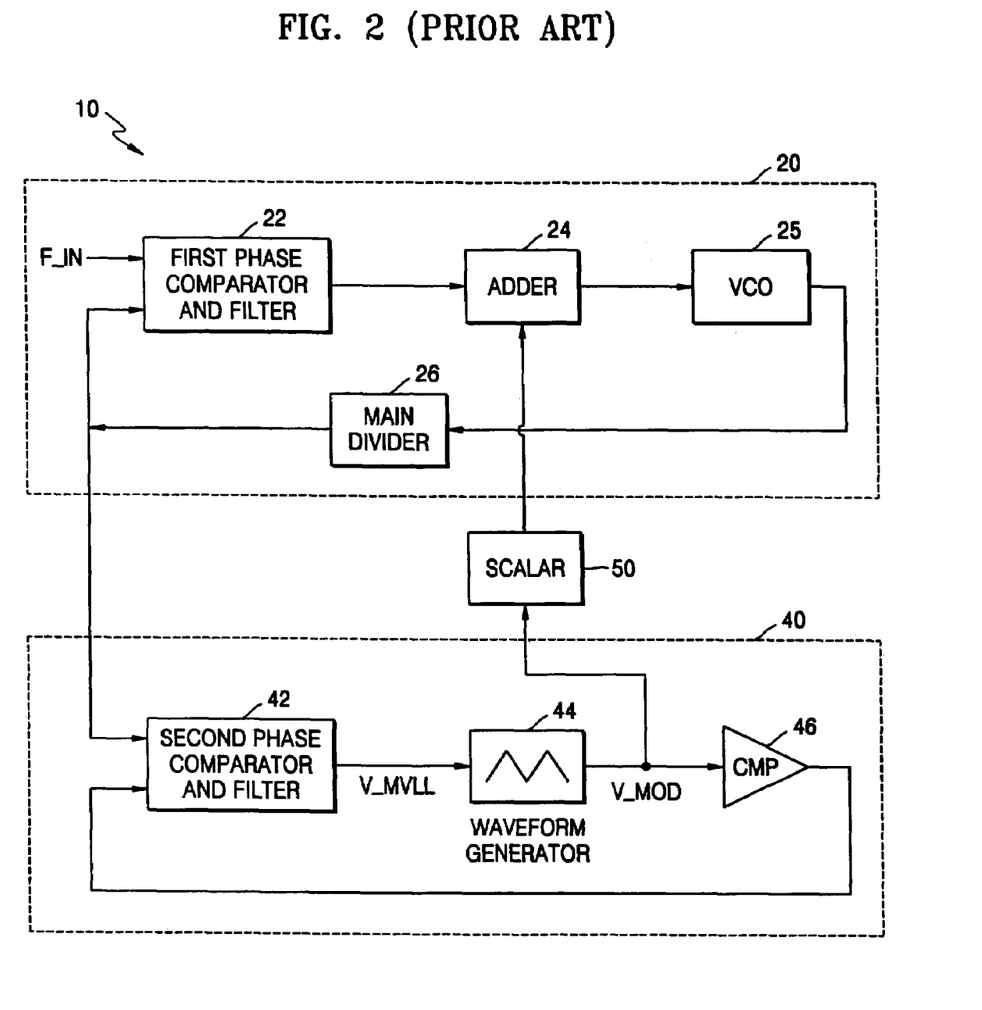
FIG. 2 is a block diagram of a prior art SSCG that uses a dual-loop to adjust a modulation rate.

FIG. 1D is a graph illustrating a clock signal having a variable frequency generated by the SSCG and the graph of FIG. 1E shows a frequency spectrum that is dispersed around the reference frequency with the energy below the given threshold energy P0. FIG. 1F is a graph illustrating the temporal frequency variation of the output signal, which may vary from 0.99 MHz to 1.01 MHz about the 1 MHz reference frequency, for example FIG. 2 is a block diagram of a prior art SSCG that adjusts a modulation rate using a dual-loop. In the SSCG using a direct modulation method, a clock modulation rate depends on the gain of a voltage controlled oscillator (VCO) and the size of a modulation charge pump directly applied to a VCO control node. Since the gain of the VCO and the size of the modulation charge pump may vary according to process-voltage-temperature (PVT) conditions or characteristics, a SSCG modulation rate thus varies with the PVT. A substantially small modulation rate results in a small spread spectrum effect, whereas a substantially large modulation rate adversely affects system operation.

For the prior art SSC signal generated using direct modulation, the size of the charge pump is manually adjusted, or the voltage of the VCO control node is adjusted using a dual-loop in order to correct the variation in modulation rate due to the PVT.

Referring now to FIG. 2, there is shown a prior art SSCG 10 which may include a dual-loop (PLL), a master loop 20 and a slave loop 40. The master loop 20 may include a first phase comparator and filter 22 which filters and compares the phase of an input signal F_IN (reference frequency) to a first feedback signal in order to generate a first output signal. The slave loop 40 includes include a second phase comparator and filter 42 which filters and compares the phases of the first feedback signal and a second feedback signal from a comparator 46 in order to generate a second output signal. The second output signal is a voltage V_MVLL is input to a waveform generator 44 to generate a modulation voltage V_MOD, which is scaled at scalar 50 and added to the first output signal at adder 24 to generate a VCO control voltage that is input to a voltage controlled oscillator (VCO) 25. The VCO 25 generates the SSC signal based on the VCO control voltage. The SSC signal is used by a main divider 26 to generate the first feedback signal that serves as an input to both the first phase comparator and filter 22 and second phase comparator and filter 42

Since the prior art SSCG 10 thus senses the voltage of a VCO control node 45 using the dual-loop, the SSCG 10 requires a sufficient modulation voltage V_MOD to satisfy the input sensitivity of the comparator 46. The V_MOD voltage should thus be scaled before being input to the adder 24. However, since the modulation rate is generally several percentage points, and the VCO control voltage generated in a master loop 20 is several volts, a voltage scalar should be precisely operated in a unit of mV.

Also, the master loop 20 and slave loop 40 occupy a substantially large surface area due to their respective filters. Since the waveform generator 44 receives the voltage V_MVLL through the filters, the waveform generator 44 changes a ripple of the voltage V_MVLL into the ripple of the voltage V_MOD, which is a random modulation, thereby reducing a spread spectrum effect.

SUMMARY OF THE INVENTION

An example embodiment of the present invention is directed to a spread spectrum clock generator (SSCG). The SSCG may include a phase and frequency detector generating a detector output signal based on a reference frequency signal and a first feedback signal input thereto, a charge pump and filter unit outputting a first control voltage signal in response to the detector output signal, and a modulation controller outputting a given modulation voltage signal based on a difference between an average frequency of a second feedback signal and a comparison frequency signal input thereto. The SSCG may include an adder adding the first control voltage signal and the modulation voltage signal to generate a second control voltage signal, a voltage control oscillator (VCO) generating the SSC signal based on the second control voltage signal, and a main divider demultiplying the SSC signal to generate the first feedback signal.

Another example embodiment of the present invention is directed to a phase-looked-loop (PLL). The PLL may include a phase and frequency detector generating a detector output signal based on a reference frequency signal and a first feedback signal input thereto, a charge pump and filter unit outputting a first control voltage signal in response to the detector output signal, and a modulation controller outputting a given modulation voltage signal based on a difference between a total phase variation of a second feedback signal and a total phase variation of a given comparison frequency signal input thereto. The PLL may include an adder adding the first control voltage signal and the modulation voltage, signal to generate a second control voltage signal, a voltage control oscillator (VCO) generating the SSC signal based on the second control voltage signal, and a main divider demultiplying the SSC signal to generate the first feedback signal.

Another example embodiment of the present invention is directed to a spread spectrum clock generator (SSCG). The SSCG may include a controller outputting a given modulation voltage signal based on a difference between an average frequency of a first feedback signal and a comparison frequency signal input thereto, a sub-system for generating a first control voltage as a function of an input reference frequency signal and a second feedback signal input thereto, an adder adding the first control voltage signal and the modulation voltage signal to generate a second control voltage signal, and a voltage control oscillator (VCO) generating the SSC signal based on the second control voltage signal.

Another example embodiment of the present invention is directed to a PLL, which may include a controller outputting a given modulation voltage signal based on a difference between a total phase variation of a first feedback signal and a total phase variation of a given comparison frequency signal input thereto. The PLL may include a sub-system for generating a first control voltage as a function of an input reference frequency signal and a second feedback signal input thereto, an adder adding the first control voltage signal and the modulation voltage signal to generate a second control voltage signal, and a voltage control oscillator (VCO) generating the SSC signal based on the second control voltage signal.

Another example embodiment of the present invention is directed to a method of generating a spread spectrum clock (SSC) signal. The method may include generating a detector output signal based on a reference frequency signal and a first feedback signal, outputting a first control voltage signal in response to the detector output signal, and outputting a given modulation voltage signal as a function of a difference in average frequencies between a second feedback signal and a comparison frequency signal. The first control voltage signal and the modulation voltage signal may be added to output a second control voltage signal that is used for generating the SSC signal, and the SSC signal demultiplied to generate the first feedback signal.

Another example embodiment of the present invention is directed to a method of generating a spread spectrum clock (SSC) signal. The method may include generating a detector output signal based on a reference frequency signal and a first feedback signal, outputting a first control voltage signal in response to the detector output signal, and outputting a given modulation voltage signal based on a difference in total phase variation between a second feedback signal and a comparison frequency signal. The first control voltage signal and the modulation voltage signal may be added to generate a second control voltage signal that is used for generating the SSC signal, and the SSC signal demultiplied to generate the first feedback signal.

Another example embodiment of the present invention is directed to a method of generating a spread spectrum clock (SSC) signal. The method may include outputting a given modulation voltage signal based on a difference in an average frequency between a first feedback signal and a comparison frequency signal, and generating a first control voltage as a function of an input reference frequency signal and a second feedback signal. The first control voltage signal and the modulation voltage signal may be added to output a second control voltage signal, and the SSC signal generated based on the second control voltage signal.

Another example embodiment of the present invention is directed to a method of generating a spread spectrum clock (SSC) signal. The method may include outputting a given modulation voltage signal based on a difference in total phase variation between a first feedback signal and a comparison frequency signal, and generating a first control voltage as a function of an input reference frequency signal and a second feedback signal. The first control voltage signal and the modulation voltage signal may be added to output a second control voltage signal, and the SSC signal generated based on the second control voltage signal.

Another example embodiment of the present invention is directed to a modulation controller of an SSCG. The modulation controller may be configured to generate a given modulation voltage signal to modulate a control voltage signal used for generating a spread spectrum clock (SSC) signal. The modulation voltage signal may be generated based on a difference in an average frequency of a portion of the SSC signal that is fed back to the modulation controller and a comparison frequency signal that is input thereto.

Another example embodiment of the present invention is directed to a modulation controller of an SSCG. The modulation controller may be configured to generate a given modulation voltage signal to modulate a control voltage signal used for generating a spread spectrum clock (SSC) signal. The modulation voltage signal may be generated based on a difference in total phase variation between a portion of the SSC signal that is fed back to the modulation controller and a comparison frequency signal that is input thereto.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of the example embodiments the present invention.

DETAILED DESCRIPTION OF THE EXAMPLE EMBODIMENTS

As will be shown in further detail below, the example embodiments of the present invention may provide a spread spectrum clock generator (SSCG) having a process-voltage-temperature-invariant modulation rate. In other words, the modulation rate is not adversely affected by variations due to one or more of (i) a manufacturing process for one or more constituent components and/or semiconductor devices of the SSCG, or 'P', (ii) a voltage, 'V', in use, and/or (iii) an operating temperature 'T'. Hereinafter, these conditions or characteristics may be referred to as 'PVT'. The example SSCG may be capable of maintaining a substantially precise modulation rate without using a separate scalar as in the prior art spread spectrum clock generator. Further, the example SSCG may have a reduced surface area consumption as compared to the prior art, in part by decreasing the number of filters required by a phase-locked loop (PLL).

Figure 3:
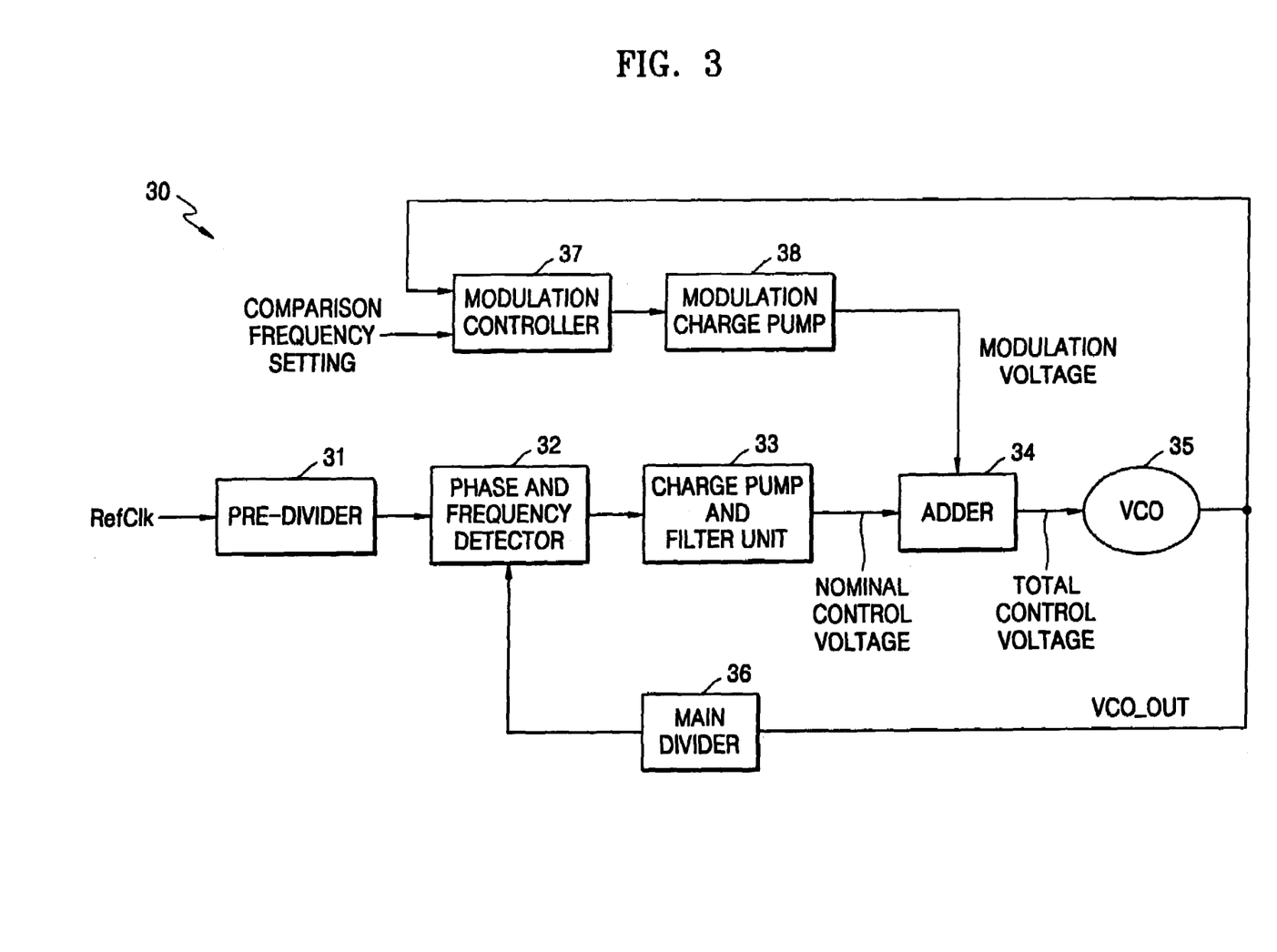
FIG. 3 is a block diagram of a SSCG according to an example embodiment of the present invention.

FIG. 3 is a block diagram illustrating a variable spread spectrum clock generator (SSCG) according to an example embodiment of the present invention. In general, and as to be described below, the SSCG 30 may be configured to digitally calculate any variation in modulation rate due to PVT characteristics by employing a voltage controlled oscillator (VCO) output signal. The SSCG 30 may adjust the current of a modulation charge pump based on the calculated modulation rate, and may be configured so as to maintain a constant modulation rate.

Referring to FIG. 3, the SSCG 30 may include a pre-divider 31, phase and frequency detector 32 and a main divider 36. The pre-divider 31 may be configured to demultiply an input signal (RefClk) so as to output a reference frequency signal. The phase and frequency detector 32 may generate a signal ('detector output signal') based on a comparison, or difference, in phase and frequency between the reference frequency signal and a first feedback signal received from the main divider 36.

The SSCG 30 may include a charge pump and filter unit 33, an adder 34 and modulation charge pump 38. In response to the received detector output signal, the charge pump and filter unit 33 may perform charge-pumping and filtering so as to output a given nominal control voltage ('first control voltage signal'). The adder 34 may add the first control voltage signal to a modulation voltage signal output by the modulation charge pump 38 so as to output a second control voltage signal. This second voltage control signal is shown as a 'total control voltage' in FIG. 3.

The SSCG 30 may include a VCO 35. Based on the received second control voltage signal from adder 34, the VCO 35 may output a spread spectrum clock (SSC) signal, shown as VCO_OUT in FIG. 3 The SSC signal may have a frequency that corresponding to the second control voltage signal, for example. As shown in FIG. 3, the SSC signal is fed to the main divider 36, which demultiplies the SSC signal to generate the feedback signal that serves as an input to the phase and frequency detector 32.

The SSCG 30 may include a modulation controller 37. In general the modulation controller 37 may output a given controller output signal which is input to the modulation charge pump 38 for generating the modulation voltage signal that is combined with the first control voltage signal at adder 34, so as to generate the aforementioned second control voltage signal.

In an example, the modulation controller 37 may calculate an average frequency for a given portion of the SSC signal, which occasionally may be referred to herein as a 'second feedback signal', which represents a feedback frequency of a given portion of the SSC signal output from VCO 35. As shown in FIG. 3, this average frequency may be compared to a given comparison frequency setting ('comparison frequency signal') so as to generate the controller output signal, which may correspond to the difference between the average and comparison frequencies.

The comparison frequency may be further defined as an upper (or first) comparison frequency and a lower (or second) comparison frequency. The upper comparison frequency may be based on an average frequency for a modulation frequency that is higher than the reference frequency (RefClk). The lower comparison frequency may be based on the average frequency for the modulation frequency which is lower than the reference frequency.

In an example, the modulation controller 37 may determine and/or extract a maximum frequency, minimum frequency and intermediate frequency from the VCO output signal (SSC signal). A first average frequency between the minimum and intermediate frequencies may be compared to the lower comparison frequency, and a second average frequency between the maximum and intermediate frequencies may be compared to the upper comparison frequency so as to output a corresponding controller output signal, which may serve as a control signal to modulation charge pump 38 for generating the modulation voltage signal.

Figure 4:
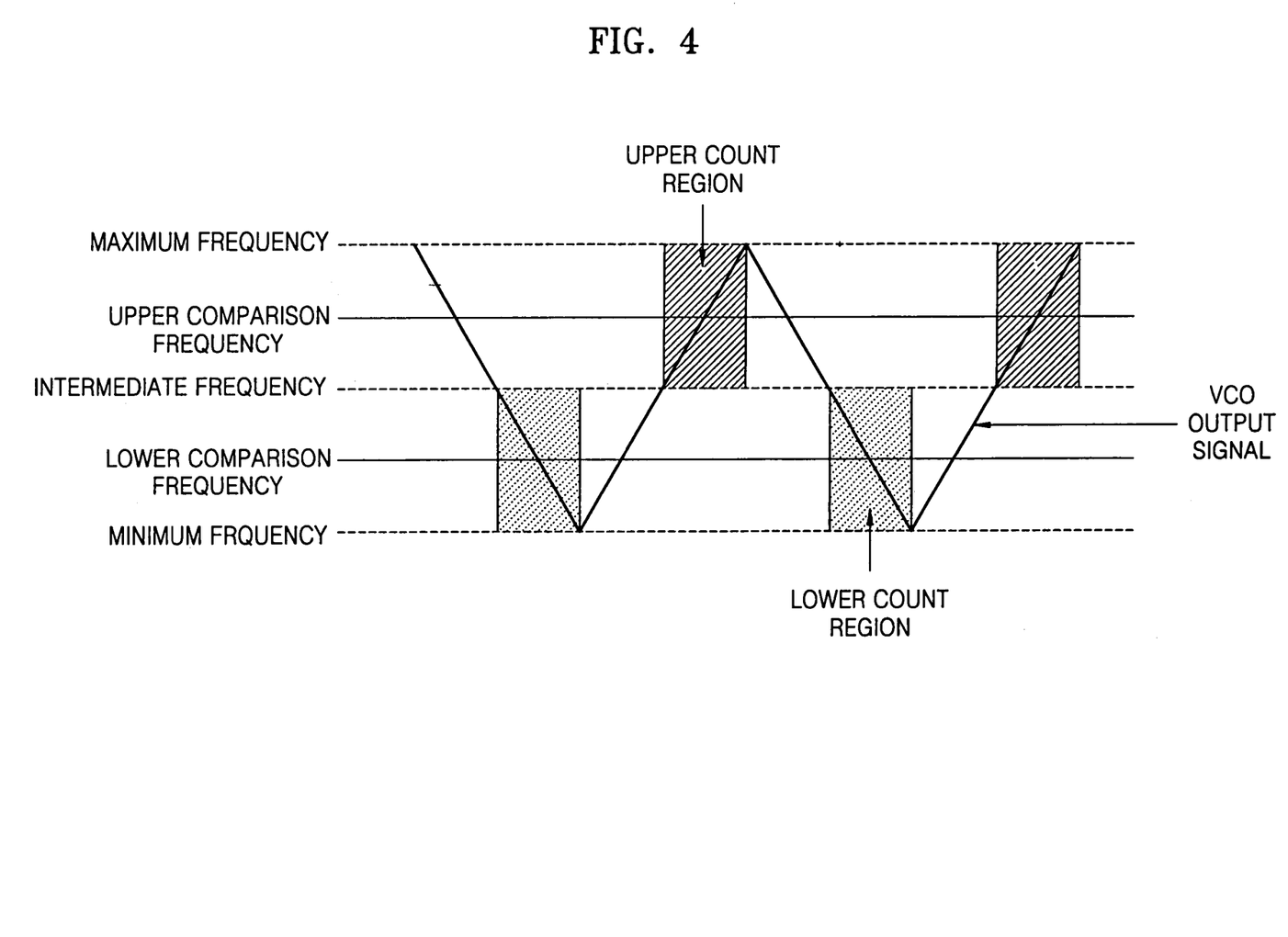
FIG. 4 is a graph illustrating temporal frequency variation of a voltage controlled oscillator (VCO) output signal versus a comparison frequency.

FIG. 4 is a graph illustrating temporal frequency variation in the VCO output signal (SSC signal) as compared to the comparison frequency. Referring to FIG. 4, the frequency of the SSC signal may vary between the aforementioned maximum and minimum frequencies based on a given modulation rate. The intermediate frequency, which may be a reference frequency, lies between the maximum frequency and the minimum frequency. The maximum and minimum frequencies may denote frequencies modulated within several percentage points of the intermediate frequency. In an example, this may be +/−1%, although this is merely one example; a range of frequencies modulated within several percentage points (e.g., from +/−1% to +/−5%) of the intermediate frequency may be evident to one of ordinary skill in the art.

The upper and lower comparison frequencies may be based on a target modulation rate, and may be used to measure the modulation rate of a spread spectrum clock in an upper count region and a lower count region, as shown by the shaded regions in FIG. 4. The upper count region may represent a region where a SSC signal output by the VCO 35 is modulated between the intermediate and maximum frequencies. The lower count region may denote a region where the SSC signal is modulated between the intermediate and minimum frequencies, for example.

The division of the comparison frequency into upper and lower comparison frequencies may be desired in order to control the modulation rate of the VCO output signal (SSC signal), as the average of the maximum and minimum frequencies is not used to obtain the size of the maximum frequency and the minimum frequency but rather the size of the intermediate frequency. Hence, an average frequency of the upper count region which is greater than the intermediate frequency, and/or an average frequency of the lower count region that is less than the intermediate frequency, may be compared with the upper and lower intermediate frequencies in order to determine the size of the maximum and minimum frequencies. When the modulation rate of the SSC signal is thus established, a first average frequency of the SSC signal in the upper count region should be the same as the upper comparison frequency, and a second average frequency of the SSC signal in the lower count region should be the same as the lower comparison frequency.

Accordingly, the modulation controller 37 may employ what may be referred to as a 'triangular modulation method'. The triangular modulation method may enable more accurate control of a modulation cycle. In an example, the maximum frequency deviation may be calculated using the change in phase over a specified time (the upper and lower count regions). This deviation calculation may be analogous to the calculation of the area of a triangle in order to obtain the height of the triangle, when the value of a base line of the triangle is already known. If base lines of triangles are identical to each other, the comparison of areas of the triangles makes it possible to compare the height of the triangles.

Therefore, the SSCG 30 as shown in FIG. 3 may also be understood as representing a phase-locked loop (PLL) composed of the illustrated constituent components. FIG. 4 thus may describe how comparisons in total phase variations by the PLL (SSCG 30) may enable the PLL to maintain a substantially precise and/or stable modulation rate.

Referring to FIG. 4, the shaded areas of the triangles may represent total phase variation. The total phase variation may be calculated using the number of clock rising edges that occur during a specified time or given duration. For example, with the modulation rate of the SSC signal established, shaded areas representing phase variation of the upper and lower comparison frequencies in FIG. 4 are the same as the sum of areas (e.g., total phase variation) of triangles formed by the spread spectrum clock (SSC) signal. As can be clearly seen, the first average frequency of the SSC signal in the upper count region is the same as the upper comparison frequency, and the second average frequency of the spread spectrum clock in the lower count region is the same as the lower comparison frequency.

Therefore, the modulation controller 37 of the example PLL 30 may compare the first average frequency and the lower comparison frequency ostensibly by comparing the total phase variation of the SSC signal to the total phase variation of a signal having the lower comparison frequency ('lower comparison frequency signal'), as the SSC signal output by the VCO 35 is changing from the intermediate frequency to the minimum frequency. The modulation controller 37 may also compare the second average frequency and the upper comparison frequency by comparing the total phase variation of the SSC signal to the total phase variation of a signal having the upper comparison frequency ('upper comparison frequency signal'), as the SSC signal output by VCO 35 is changing from the intermediate frequency to the maximum frequency. The modulation controller 37 may output a control signal corresponding to the comparison result, which is the aforementioned controller output signal.

Based on the controller output signal (e.g., control signal) the modulation charge pump 38 may pump charge and generate the modulation voltage signal at a given modulation rate. The following example describes modulation controller 37 and modulation charge pump 38 interaction for the SSC signal transition from the intermediate to minimum frequencies in the example PLL 30. As the SSC signal output by the VCO 35 changes from the intermediate to the minimum frequency, and if the total phase variation of the SSC signal exceeds the total phase variation of the signal having the lower comparison frequency (as determined by modulation controller 37), the modulation charge pump 38 may raise its current and hence raise the modulation rate, in response to the controller output signal received from modulation controller 37. Conversely as the SSC signal changes from the intermediate to the minimum frequency, if the total phase variation of the SSC signal is less than the total phase variation of the signal having the lower comparison frequency, the modulation charge pump 38 may lower its current and hence reduce the modulation rate.

The following example describes modulation charge pump 38 operation for the SSC signal transition from the intermediate to maximum frequencies. As the SSC signal output by the VCO 35 changes from the intermediate to maximum frequency, the modulation charge pump 38 may lower its current and hence reduce the modulation rate if the total phase variation of the SSC signal is greater than the total phase variation of the signal having the upper comparison frequency. Conversely, the modulation charge pump 38 may raise its current and hence modulation rate if the total phase variation of the SSC signal is less than the total phase variation of the signal having the upper comparison frequency.

In another example, the total phase variation may be digitally calculated by counting the clock rising edges of the SSC signal. For example, if the number of clock rising edges is 30, the total phase variation is roughly 30×360°. Counting of the clock rising edges may enable the total phase variation to be calculated so as to determine an average frequency. In an example, the count of rising edges for the comparison frequency (clock) may be calculated in advance. The may be done by counting the rising edges of the comparison frequency clock over a specified period or given duration (such as ¼ of a modulation period). Accordingly, during the given duration the rising edges of the SSC clock may be compared to a digital setting value or digital word representing the count of the rising edges of the comparison frequency calculated in advance (e.g. total phase variation of the comparison frequency). In other words, the comparison may be performed by setting a digital register value and determining which of the average SSC clock frequency and the comparison frequency is larger.

Accordingly, in another example illustrating modulation charge pump 38 operation for the SSC signal transition from the intermediate to minimum frequencies, the modulation controller 37 may compare the first average frequency and the lower comparison frequency by comparing the number of rising edges of the SSC signal to the number of rising edges of the signal having the lower comparison frequency (determined in advance), during SSC signal output from VCO 35's transition from the intermediate frequency to the minimum frequency. Additionally during the transition, the modulation controller 37 may compare the second average frequency and the upper comparison frequency by comparing the number of rising edges of the spread spectrum clock signal to the number of rising edges of the signal having the upper comparison frequency. The modulation charge pump 38 may pump charge and generate the modulation voltage signal based on the comparison between the respective counts of rising edges (e.g., rising edge counts for SSC signal/upper comparison frequency and SSC signal/lower comparison frequency).

If (during the intermediate/minimum frequency transition) the rising edge count of the SSC clock exceeds the rising edge count for the lower comparison frequency signal (which as discussed above may be represented as a known digital setting vale or digital word), the modulation charge pump 38 may raise its current and hence modulation rate. Conversely, the modulation charge pump 38 may lower its current and reduce the modulation rate where the rising edge count of the SSC clock is less than the rising edge count for the lower comparison frequency signal.

For the intermediate to maximum frequency transition of the SSC signal output from VCO 35, a similar comparison may be done between the rising edge counts of the SSC signal and that of the upper comparison frequency signal. Where rising edge counts (e.g., total phase variation) of the SSC signal exceeds the counts (total phase variation) of the upper comparison frequency signal, the modulation charge pump 38 lowers its current to reduce the modulation rate. Conversely, the modulation charge pump 38 raises its current to increase the modulation rate where the rising edge count of the SSC signal is less than the corresponding of rising edges for the upper comparison frequency signal.

The modulation voltage signal thus output by the modulation charge pump 38 may be added in adder 34 to the first control voltage output by the charge pump and filter unit 33. The VCO 35 may thus generate a SSC signal that has been modulated according to the reference frequency, e.g. the intermediate frequency of FIG. 4, in response to the third control voltage signal.

As shown in FIG. 4, since the SSCG 30 enables a digital comparison between the comparison frequency setting and a feedback frequency of the SSC signal, the SSCG 30 may be invariant to PVT characteristics or conditions. Further, the SSCG 30 no longer requires a separate scalar or additional filter unit in the PLL, for example, shown in FIG. 2, thereby maintaining a precise modulation rate while reducing a circuit area.

Figure 5A:
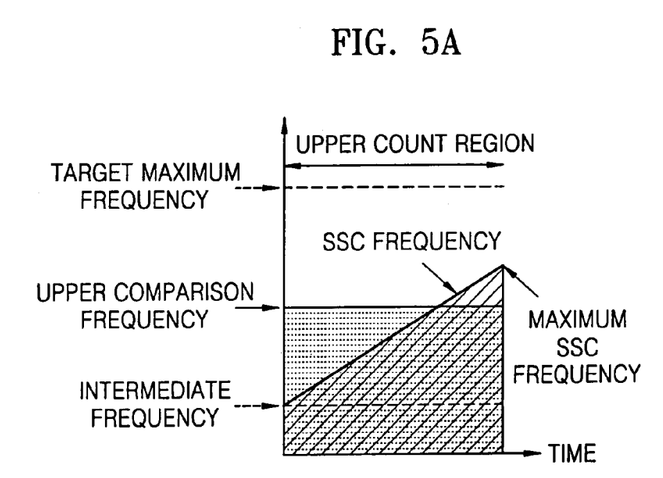
FIGS. 5A through 5D are graphs illustrating a frequency modulation rate of the SSCG according to another example embodiment of the present invention.

FIGS. 5A through 5D are graphs illustrating a frequency modulation rate of the SSCG according to an example embodiment of the present invention. The graph of FIG. 5A shows a target maximum frequency versus a maximum frequency of the spread spectrum clock output by the VCO 35. In this example, the SSC signal is not spread as desired due to a maximum frequency that is lower than the target maximum frequency. In this case, the energy of the SSC signal exceeds a given energy target or threshold level, thereby causing EMI to a neighboring circuit.

Since in this example the maximum frequency is lower than the target maximum frequency, the upper comparison frequency is higher than the second average frequency (e.g., average of the intermediate and maximum frequencies of the SSC signal). As a result, the number of clock cycles of the upper comparison frequency signal is greater than the number of clock cycles of a signal having the second average frequency ('second average frequency signal') during the same time.

For the intermediate-to-maximum frequency transition of the SSC clock output of VCO 35, the modulation controller 37 may determine that SSC signal rising edge count is less than the count of the upper comparison frequency signal (which has been determined in advance and is represented by a digital setting value, for example). The modulation controller 37 may thus raise its current and increase the modulation rate, so that the maximum frequency of the SSC signal approaches the target maximum frequency.

Figure 5B:
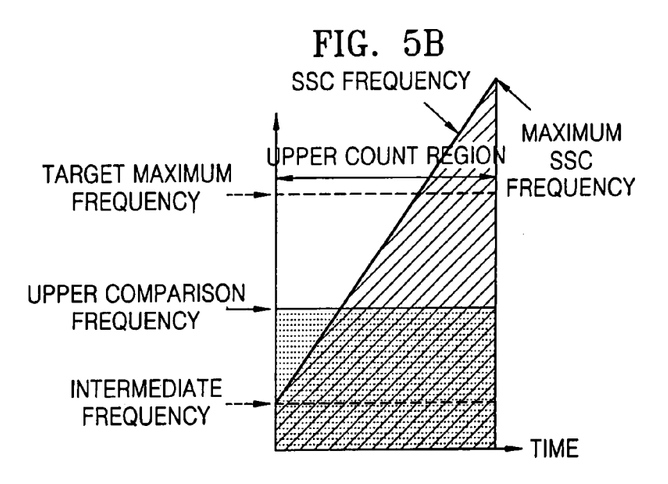

FIG. 5B is a graph illustrating a situation where the maximum frequency of the SSC signal is higher than the target maximum frequency, because the SSC signal has a substantially large frequency modulation deviation. In this case, the larger frequency modulation deviation may cause malfunction of electronic circuits.

As shown in FIG. 5B, the upper comparison frequency is lower than the second average frequency (e.g., average of the intermediate and maximum frequencies of the SSC signal. As a result, the number of clock cycles of the signal having the upper comparison frequency (upper comparison frequency signal) is less than the number of clock cycles of the second average frequency signal during the same time.

For the intermediate-to-maximum frequency transition of the SSC signal output of VCO 35, the modulation controller 37 may determine that the rising edge count in the SSC signal is greater than the count of the upper comparison frequency signal. The modulation controller 37 may lower its current and reduce the modulation rate, so that the maximum frequency of the SSC signal approaches the target maximum frequency.

Figure 5C:
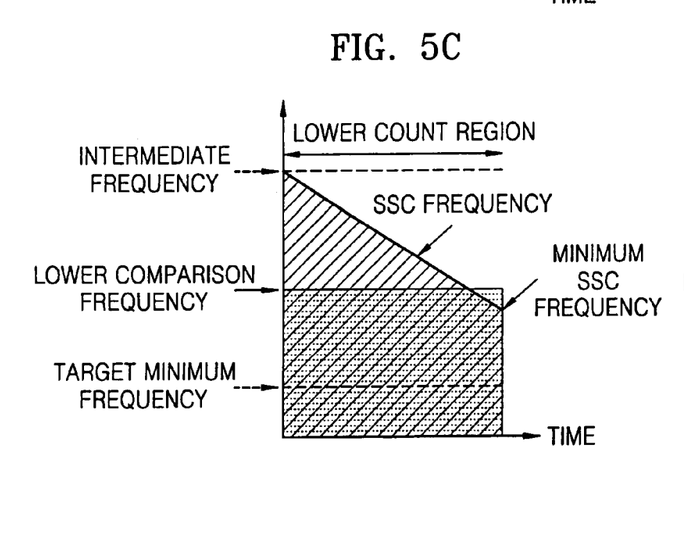

FIG. 5C is a graph illustrating a situation where the minimum frequency of the SSC output by the VCO is higher than the target minimum frequency because the SSC signal is not spread as desired. As shown in FIG. 5C, the energy of the SSC signal exceeds a given energy range, thereby causing EMI in a neighboring circuit.

In this case as shown in FIG. 5C, the lower comparison frequency is lower than the first average frequency (e.g., average of the intermediate and minimum frequencies of the SSC signal). As a result, the number of clock cycles of the lower comparison frequency signal is less than the number of clock cycles of a signal having the first average frequency ('first average frequency signal') during the same time.

For the intermediate-to-minimum frequency transition of the SSC signal output of VCO 35, the modulation controller 37 may determine that the rising edge count in the SSC signal is greater than the count of the lower comparison frequency signal. The modulation controller 37 may raise its current and increase the modulation rate, so that the minimum frequency of the SSC signal approaches the target minimum frequency.

Figure 5D:
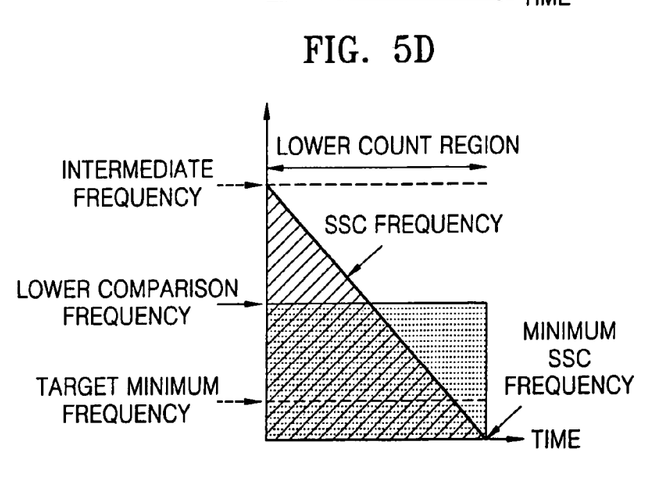

FIG. 5D is a graph illustrating a situation where the minimum frequency of the SSC is lower than the target minimum frequency because the SSC signal has a substantially large frequency modulation deviation, which may cause malfunction of the electronic circuit.

In this case as shown in FIG. 5D, the lower comparison frequency is higher than the first average frequency (e.g., average of the intermediate and minimum frequencies of the SSC signal). As a result, the number of clock cycles of the lower comparison frequency signal is greater than the number of clock cycles of the first average frequency signal during the same time.

For the intermediate-to-minimum frequency transition of the SSC signal output of VCO 35, the modulation controller 37 may determine that the rising edge count in the SSC signal is less than the count of the lower comparison frequency signal. The modulation controller 37 may thus lower its current and hence reduce the modulation rate, so that the minimum frequency of the SSC signal approaches the target minimum frequency.

Figure 6A:
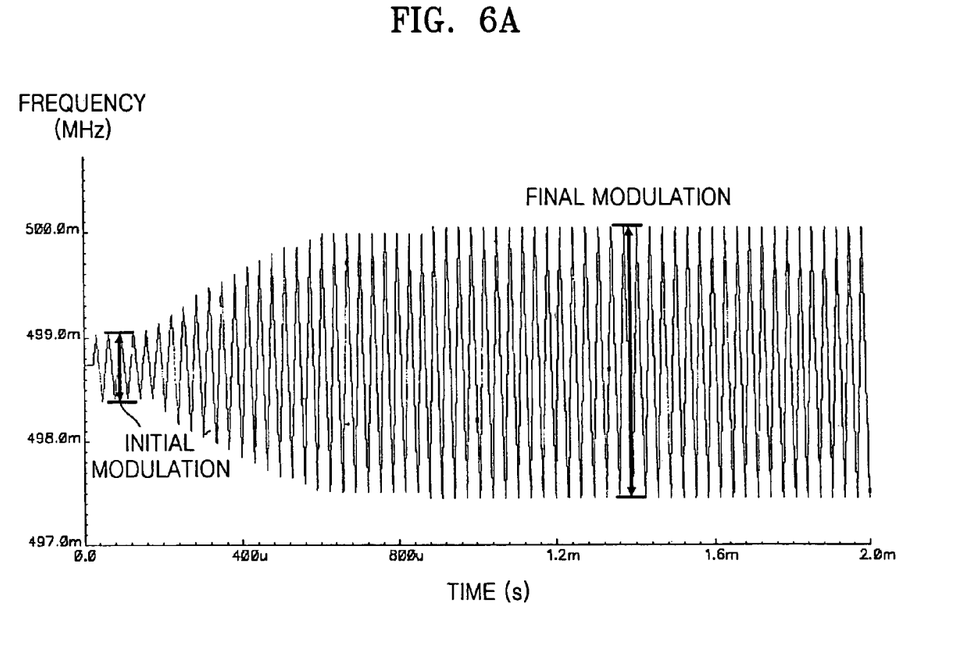
FIG. 6A is a graph illustrating a target modulation value of the SSCG when an initial modulation charge pump has an extremely small size.
Figure 6B:
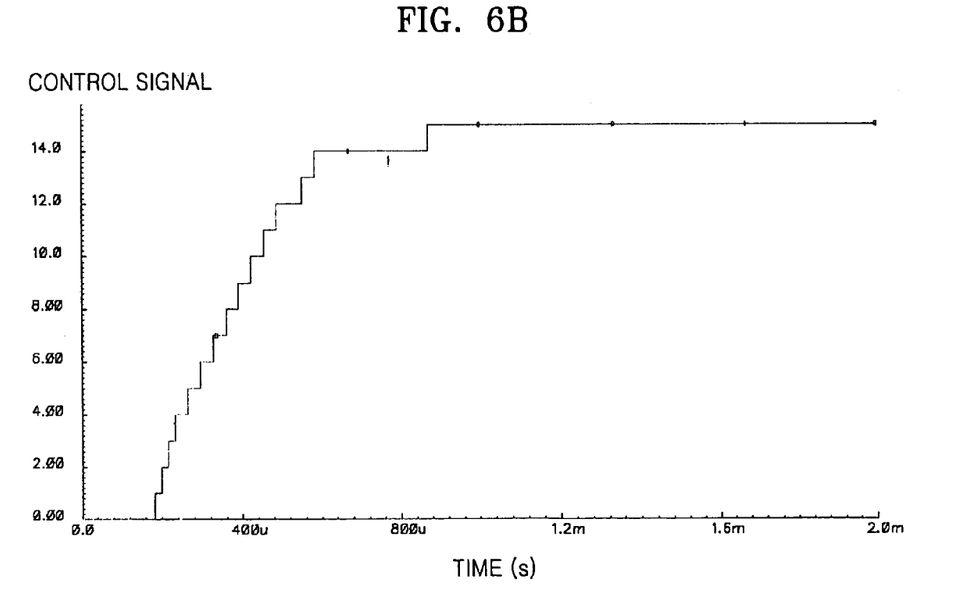
FIG. 6B is a graph illustrating a control signal output by the modulation controller 37 in the case of FIG. 6A.

FIG. 6A is a graph illustrating a target modulation value of the SSCG when an initial modulation charge pump has an extremely small size. FIG. 6B is a graph illustrating a control signal output by the modulation controller 37 in the case of FIG. 6A. Referring to FIGS. 6A and 6B, the extremely small quantity of the initial modulation charge pump may cause the SSC to have a small frequency modulation deviation. The modulation controller 37 may determine that the total number of SSCs in the upper count region is less than the number of target SSCs, thereby increasing the volume of the control signal, and the size of the modulation charge pump.

Figure 7A:
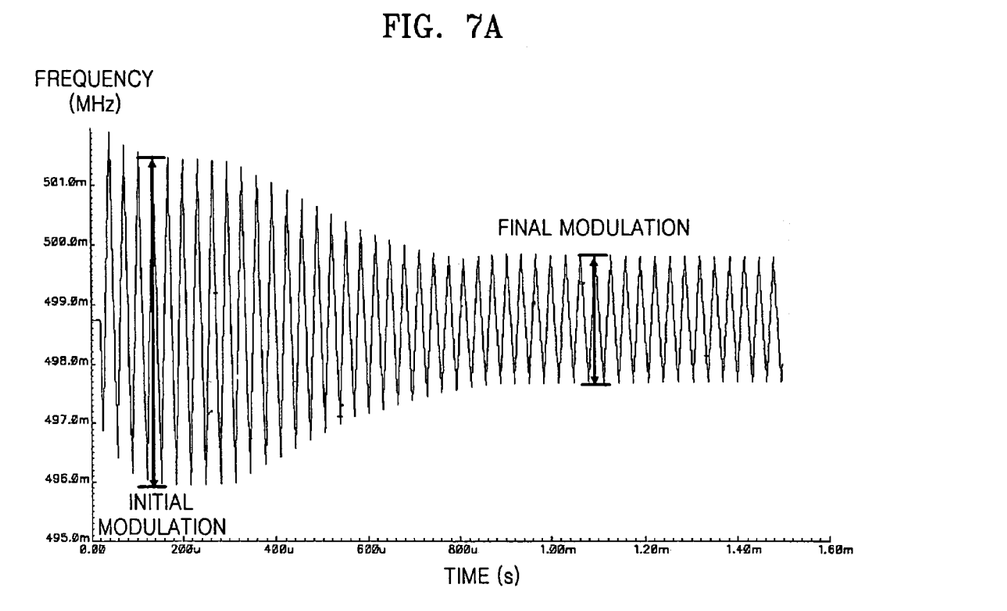
FIG. 7A is a graph illustrating the target modulation value of the SSCG when the initial modulation charge pump has an extremely large size.
Figure 7B:
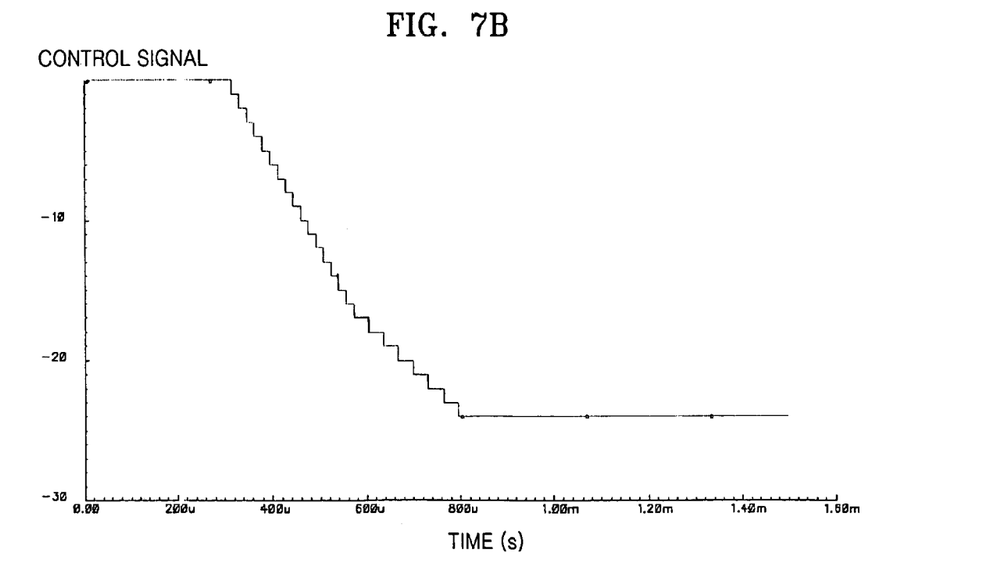
FIG. 7B is a graph illustrating the control signal output by the modulation controller 37 shown in FIG. 7A.

FIG. 7A is a graph illustrating the target modulation value of the SSCG 30 when an initial modulation charge pump has a substantially large size. FIG. 7B is a graph illustrating the volume of the control signal (e.g., controller output signal) output by the modulation controller 37 in the case of FIG. 7A.

Referring to FIGS. 7A and 7B, the substantially large size of the initial modulation charge pump may cause the SSC signal to have a substantial frequency modulation deviation. The modulation controller 37 may determine that the total number of SSC signals in the upper count region is more than the number of target SSC signal, thereby reducing the size and/or value of the control signal and hence size of the modulation charge pump. As a result, the example SSCG 30 may have a PVT invariant target modulation rate through the use of digital control. Accordingly, the SSCG 30 may be configured to generate a stable SSC signal.

While example embodiments of the present invention have been particularly shown and described, it will be understood by those of ordinary skill in the art that various changes in form and details may be made therein without departing from the spirit and scope of the example embodiments of the present invention, as defined by the following claims.

What is claimed is:

1. A spread spectrum clock generator (SSCG), comprising:
   a phase and frequency detector generating a detector output signal based on a reference frequency signal and a first feedback signal input thereto,
   a charge pump and filter unit outputting a first control voltage signal in response to the detector output signal,
   a modulation controller outputting a given modulation voltage signal based on a difference between an average frequency of a second feedback signal and a comparison frequency signal input thereto,
   an adder adding the first control voltage signal and the modulation voltage signal to generate a second control voltage signal,
   a voltage control oscillator (VCO) generating the SSC signal based on the second control voltage signal, and
   a main divider demultiplying the SSC signal to generate the first feedback signal, wherein
      the modulation controller is configured to calculate the average frequency of the SSC signal for a given transition in frequency as the SSC signal is output by the VCO and compare the calculated average frequency to the comparison frequency; and
      the comparison frequency includes an upper comparison frequency and a lower comparison frequency representing reference frequencies of a target modulation rate for the SSC signal output by the VCO.

2. The SSCG of claim 1, further comprising:
   a pre-divider demultiplying an input signal to generate the reference frequency signal that is input to the phase and frequency detector.

3. The SSCG of claim 1, wherein the phase and frequency detector generates the detector output signal according to a difference in phase and frequency between the reference frequency and first feedback signals.

4. The SSCG of claim 1, wherein the charge pump and filter unit is further configured for charge-pumping and filtering the received detector output signal to generate the first control voltage signal.

5. The SSCG of claim 1, wherein the modulation controller is further configured to control a charge pump based on the comparison.

6. The SSCG of claim 1, wherein
   the comparison frequency is calculated in advance over a given duration and is represented as a digital setting, and
   the digital setting and the calculated average SSC frequency are compared for determining a control signal for controlling the charge pump.

7. The SSCG of claim 1, wherein the SSC signal output by the VCO has a frequency corresponding to the frequency of the second control voltage signal.

8. The SSCG of claim 1, wherein the second feedback signal represents a feedback frequency of the generated SSC signal.

9. The SSCG of claim 1, wherein
   the modulation controller is adapted to determine a maximum frequency, minimum frequency, and intermediate frequency from the SSC signal output by the VCO, to compare a first average frequency representing an average of the minimum and intermediate frequencies with the lower comparison frequency, and to compare a second average frequency representing an average of the maximum and intermediate frequencies with the upper comparison frequency.

10. The SSCG of claim 9, wherein
    as the SSC signal output by the VCO transitions from the intermediate to minimum frequency, the comparison by the modulation controller of the first average frequency to the lower comparison frequency further includes comparing a count of rising edges of the SSC signal to a count of rising edges of a signal with the lower comparison frequency, and
    as the SSC signal output by the VCO transitions from the intermediate to maximum frequency, the comparison by the modulation controller of the second average frequency to the upper comparison frequency further includes comparing a count of rising edges of the SSC signal to a count of rising edges of a signal with the upper comparison frequency.

11. The SSCG of claim 10, further comprising:
    a modulation charge pump charge pumping and generating the modulation voltage signal at a given modulation rate according to the compared counts of rising edges received from the modulation controller.

12. The SSCG of claim 11, wherein, as the SSC signal is changing from the intermediate frequency to the minimum frequency:
    the modulation charge pump raises its current and increases the modulation rate based on the received controller output signal, if the rising edge count of the SSC signal is greater than the rising edge count of the lower comparison frequency signal, and
    the modulation charge pump lowers its current and reduces the modulation rate based on the received controller output signal, if the rising edge count of the SSC signal is less than the rising edge count of the lower comparison frequency signal.

13. The SSCG of claim 11, wherein, as the SSC signal is changing from the intermediate frequency to the maximum frequency:
    the modulation charge pump lowers its current and reduces the modulation rate based on the received controller output signal, if the rising edge count of the SSC signal is greater than the rising edge count of the upper comparison frequency signal, and
    the modulation charge pump raises its current and increases the modulation rate based on the received controller output signal, if the rising edge count of the SSC signal is less than the rising edge count of the upper comparison frequency signal.

14. The SSCG of claim 9, wherein as the SSC signal output by the VCO transitions from the intermediate to minimum frequency, the comparison by the modulation controller of the first average frequency to the lower comparison frequency further includes comparing a total phase variation of the SSC signal to a total phase variation of the lower comparison frequency signal, and as the SSC signal output by the VCO transitions from the intermediate to maximum frequency, the comparison by the modulation controller of the second average frequency to the upper comparison frequency further includes comparing a total phase variation of the SSC signal to a total phase variation of the upper comparison frequency signal.

15. The SSCG of claim 14, further comprising:

a modulation charge pump charge pumping and generating the modulation voltage signal at a given modulation rate according to the phase variations, as represented by the controller output signal received from the modulation controller.

16. The SSCG of claim 15, wherein, as the SSC signal is changing from the intermediate frequency to the minimum frequency:

the modulation charge pump raises its current and increases the modulation rate based on the received controller output signal, if the total phase variation of the SSC signal is greater than the total phase variation of the lower comparison frequency signal, and the modulation charge pump lowers its current and reduces the modulation rate based on the received controller output signal if the total phase variation of the SSC signal is less than the total phase variation of the lower comparison frequency signal.

17. The SSCG of claim 15, wherein, as the SSC signal is changing from the intermediate frequency to the maximum frequency:

the modulation charge pump lowers its current and reduces the modulation rate based on the received controller output signal, if the total phase variation of the SSC signal is greater than the total phase variation of the upper comparison frequency signal, and the modulation charge pump raises its current and increases the modulation rate based on the received controller output signal, if the total phase variation of the SSC signal is less than the total phase variation of the upper comparison frequency signal.

18. A phase-looked-loop (PLL) comprising:

a phase and frequency detector generating a detector output signal based on a reference frequency signal and a first feedback signal input thereto, a charge pump and filter unit outputting a first control voltage signal in response to the detector output signal, a modulation controller outputting a given modulation voltage signal based on a difference between a total phase variation of a second feedback signal and a total phase variation of a given comparison frequency signal input thereto, an adder adding the first control voltage signal and the modulation voltage, signal to generate a second control voltage signal, a voltage control oscillator (VCO) generating the SSC signal based on the second control voltage signal, and a main divider demultiplying the SSC signal to generate the first feedback signal, wherein the modulation controller is configured to calculate the total phase variation of the SSC signal for a given transition in frequency as the SSC signal is output by the VCO, and to compare the calculated total phase variation of the SSC signal to a total phase variation of the comparison frequency; and the comparison frequency includes an upper comparison frequency and a lower comparison frequency representing reference frequencies of a target modulation rate for the SSC signal output by the VCO.

19. The PLL of claim 18, further comprising:

a pre-divider demultiplying an input signal to generate the reference frequency signal that is input to the phase and frequency detector.

20. The PLL of claim 18, wherein the phase and frequency detector generates the detector output signal according to a difference in phase and frequency between the reference frequency and first feedback signals.

21. The PLL of claim 18, wherein the charge pump and filter unit is further configured for charge-pumping and filtering the received detector output signal to generate the first control voltage signal.

22. The PLL of claim 18, wherein the modulation controller is further configured to control a charge pump based on the comparison.

23. The PLL of claim 22, wherein the comparison frequency is calculated in advance over a given duration and is represented as a digital setting, and the digital setting and the calculated average SSC frequency are compared for determining a control signal for controlling the charge pump.

24. The PLL of claim 18, wherein the SSC signal output by the VCO has a frequency corresponding to the frequency of the second control voltage signal.

25. The PLL of claim 18, wherein the second feedback signal represents a feedback frequency of the generated SSC signal.

26. The PLL of claim 18, further comprising:

a modulation charge pump charge pumping and generating the modulation voltage signal according to the total phase variations, as represented by the controller output signal received from the modulation controller.

27. The PLL of claim 26, wherein the modulation controller is adapted to determine a maximum frequency, minimum frequency, and intermediate frequency from the SSC signal output by the VCO, as the SSC signal is changing from the intermediate frequency to the minimum frequency, the modulation controller is adapted to compare a total phase variation of the SSC signal output by the VCO with a total phase variation of a signal having the lower comparison frequency, and as the SSC signal is changing from the intermediate frequency to the maximum frequency, the modulation controller is adapted to compare the total phase variation of the SSC signal with a total phase variation of a signal having the upper comparison frequency.

28. The PLL of claim 27, wherein, as the SSC signal is changing from the intermediate frequency to the minimum frequency:

the modulation charge pump raises its current and increases the modulation rate based on the received controller output signal, if the total phase variation of the SSC signal is greater than the total phase variation of the lower comparison frequency signal, and the modulation charge pump lowers its current and reduces the modulation rate based on the received controller output signal, if the total phase variation of the SSC signal is less than the total phase variation of the lower comparison frequency signal.

29. The PLL of claim 27, wherein, as the SSC signal is changing from the intermediate frequency to the maximum frequency:
the modulation charge pump lowers its current and reduces the modulation rate based on the received controller output signal, if the total phase variation of the SSC signal is greater than the total phase variation of the upper comparison frequency signal, and
the modulation charge pump raises its current and increases the modulation rate based on the received controller output signal, if the total phase variation of the SSC signal is less than the total phase variation of the upper comparison frequency signal.

30. The PLL of claim 26, wherein
as the SSC signal output by the VCO transitions from the intermediate to minimum frequency, the comparison by the modulation controller of the total number of phase variations further includes comparing a count of rising edges of the SSC signal to a count of rising edges of lower comparison frequency signal, and
as the SSC signal output by the VCO transitions from the intermediate to maximum frequency, the comparison by the modulation controller of the total number of phase variations further includes comparing a count of rising edges of the SSC signal to a count of rising edges of the upper comparison frequency signal.

31. A spread spectrum clock generator (SSCG), comprising:
a controller outputting a given modulation voltage signal based on a difference between an average frequency of a first feedback signal and a comparison frequency signal input thereto,
a sub-system for generating a first control voltage as a function of an input reference frequency signal and a second feedback signal input thereto,
an adder adding the first control voltage signal and the modulation voltage signal to generate a second control voltage signal, and
a voltage control oscillator (VCO) generating the SSC signal based on the second control voltage signal, wherein
the first feedback signal is a feedback frequency of the SSC signal generated by the VCO;
the controller is configured to calculate the average frequency of the fed back SSC signal for a given transition in frequency as the SSC signal is output by the VCO and to compare the calculated average frequency to the comparison frequency; and
the comparison frequency includes an upper comparison frequency and a lower comparison frequency representing reference frequencies of a target modulation rate for the SSC signal output by the VCO.

32. The SSCG of claim 31, wherein the subsystem includes
a pre-divider demultiplying an input signal to generate the reference frequency signal,
a phase and frequency detector generating a detector output signal based on the reference frequency signal and the second feedback signal, and
a charge pump and filter unit outputting the first control voltage signal in response to the detector output signal.

33. The SSCG of claim 32, wherein the phase and frequency detector generates the detector output signal according to a difference in phase and frequency between the reference frequency and second feedback signals.

34. The SSCG of claim 32, wherein the charge pump and filter unit is further configured for charge-pumping and filtering the received detector output signal to generate the first control voltage signal.

35. The SSCG of claim 31, wherein
the controller is further configured to control a charge pump based on the comparison.

36. The SSCG of claim 35, wherein
the comparison frequency is calculated in advance over a given duration and is represented as a digital setting, and
the digital setting and the calculated average SSC frequency are compared for determining a control signal for controlling the charge pump.

37. The SSCG of claim 31, wherein the SSC signal output by the VCO has a frequency corresponding to the frequency of the second control voltage signal.

38. The SSCG of claim 31, further comprising:
a main divider demultiplying the SSC signal to generate the second feedback signal.

39. A PLL, comprising:
a controller outputting a given modulation voltage signal based on a difference between a total phase variation of a first feedback signal and a total phase variation of a given comparison frequency signal input thereto,
a sub-system for generating a first control voltage as a function of an input reference frequency signal and a second feedback signal input thereto,
an adder adding the first control voltage signal and the modulation voltage signal to generate a second control voltage signal, and
a voltage control oscillator (VCO) generating the SSC signal based on the second control voltage signal, wherein
the first feedback signal represents a feedback frequency of the SSC signal generated by the VCO,
the controller is configured to calculate the total phase variation of the fed back SSC signal for a given transition in frequency as the SSC signal is output by the VCO and to compare the calculated total phase variation of the SSC signal to a total phase variation of the comparison frequency; and
the comparison frequency includes an upper comparison frequency and a lower comparison frequency representing reference frequencies of a target modulation rate for the SSC signal output by the VCO.

40. The PLL of claim 39, wherein the subsystem includes:
a pre-divider demultiplying an input signal to generate the reference frequency signal,
a phase and frequency detector generating a detector output signal based on the reference frequency signal and the second feedback signal, and
a charge pump and filter unit outputting the first control voltage signal in response to the detector output signal.

41. The PLL of claim 40, wherein the phase and frequency detector generates the detector output signal according to a difference in phase and frequency between the reference frequency and second feedback signals.

42. The PLL of claim 40, wherein the charge pump and filter unit is further configured for charge-pumping and filtering the received detector output signal to generate the first control voltage signal.

43. The PLL of claim 39, wherein
the controller is further configured control a charge pump based on the comparison.

44. The PLL of claim 43, wherein
the comparison frequency is calculated in advance over a given duration and is represented as a digital setting, and the digital setting and the calculated average SSC frequency are compared for determining a control signal for controlling the charge pump.

45. The PLL of claim 39, wherein the SSC signal output by the VCO has a frequency corresponding to the frequency of the second control voltage signal.

46. The PLL of claim 39, further comprising:
a main divider demultiplying the SSC signal to generate the second feedback signal.

47. A method of generating a spread spectrum clock (SSC) signal, comprising:
generating a detector output signal based on a reference frequency signal and a first feedback signal,
outputting a first control voltage signal in response to the detector output signal,
outputting a given modulation voltage signal as a function of a difference between an average frequency of a second feedback signal and a comparison frequency signal,
adding the first control voltage signal and the modulation voltage signal to output a second control voltage signal that is used for generating the SSC signal, and,
demultiplying the SSC signal to generate the first feedback signal, wherein
a modulation controller is configured to calculate the average frequency of the SCC signal for a given transition in frequency as the SSC signal is output by a voltage control oscillator (VCO) and to compare the calculated average frequency to the comparison frequency; and
the comparison frequency includes an upper comparison frequency and a lower comparison frequency representing reference frequencies of a target modulation rate for the SSC signal output by the VCO.

48. The method of claim 47, wherein the second feedback signal represents a feedback frequency of the generated SSC signal.

49. A method of generating a spread spectrum clock (SSC) signal, comprising:
generating a detector output signal based on a reference frequency signal and a first feedback signal,
outputting a first control voltage signal in response to the detector output signal,
outputting a given modulation voltage signal based on a difference between a total phase variation of a second feedback signal and a total phase variation of a comparison frequency signal,
adding the first control voltage signal and the modulation voltage signal to generate a second control voltage signal that is used for generating the SSC signal, and
demultiplying the SSC signal to generate the first feedback signal, wherein
a modulation controller is configured to calculate the total phase variation of the SSC signal for a given transition in frequency as the SSC signal is output by a voltage control oscillator (VCO), and to compare the calculated total phase variation of the SSC signal to a total phase variation of the comparison frequency; and
the comparison frequency includes an upper comparison frequency and a lower comparison frequency representing reference frequencies of a target modulation rate for the SSC signal output by the VCO.

50. The method of claim 49, wherein the second feedback signal represents a feedback frequency of the generated SSC signal.

51. A method of generating a spread spectrum clock (SSC) signal, comprising:
outputting a given modulation voltage signal based on a difference between an average frequency of a first feedback signal and a comparison frequency signal,
generating a first control voltage as a function of an input reference frequency signal and a second feedback signal,
adding the first control voltage signal and the modulation voltage signal to output a second control voltage signal, and
generating the SSC signal based on the second control voltage signal, wherein
a modulation controller is configured to calculate the average frequency of the SCC signal for a given transition in frequency as the SSC signal is output by a voltage control oscillator (VCO) and to compare the calculated average frequency to the comparison frequency; and
the comparison frequency includes an upper comparison frequency and a lower comparison frequency representing reference frequencies of a target modulation rate for the SSC signal output by the VCO.

52. A method of generating a spread spectrum clock (SSC) signal, comprising:
outputting a given modulation voltage signal based on a difference between a total phase variation of a first feedback signal and a total phase variation of a comparison frequency signal,
generating a first control voltage as a function of an input reference frequency signal and a second feedback signal,
adding the first control voltage signal and the modulation voltage signal to output a second control voltage signal, and
generating the SSC signal based on the second control voltage signal, wherein
a modulation controller is configured to calculate the total phase variation of the SSC signal for a given transition in frequency as the SSC signal is output by a voltage control oscillator (VCO), and to compare the calculated total phase variation of the SSC signal to a total phase variation of the comparison frequency; and
the comparison frequency includes an upper comparison frequency and a lower comparison frequency representing reference frequencies of a target modulation rate for the SSC signal output by the VCO.

53. A modulation controller of an SSCG, the modulation controller configured to generate a given modulation voltage signal to modulate a control voltage signal used for generating a spread spectrum clock (SSC) signal, the modulation voltage signal generated based on a difference in an average frequency of a portion of the SSC signal that is fed back to the modulation controller and a comparison frequency signal that is input thereto, wherein
the modulation controller is configured to calculate the average frequency of the portion of the SSC signal for a given transition in frequency as the SSC signal is output by a voltage control oscillator (VCO) and to compare the calculated average frequency to the comparison frequency; and
the comparison frequency includes an upper comparison frequency and a lower comparison frequency representing reference frequencies of a target modulation rate for the SSC signal output by the VCO.

54. A modulation controller of an SSCG, the modulation controller configured to generate a given modulation voltage signal to modulate a control voltage signal used for generating a spread spectrum clock (SSC) signal, the modulation voltage signal generated based on a difference in total phase variation between a portion of the SSC signal that is fed back to the modulation controller and a total phase variation of a comparison frequency signal that is input thereto, wherein the modulation controller is configured to calculate the total phase variation of the portion of the SSC signal for a given transition in frequency as the SSC signal is output by a voltage control oscillator (VCO), and to compare the calculated total phase variation of the SSC signal to a total phase variation of the comparison frequency; and the comparison frequency includes an upper comparison frequency and a lower comparison frequency representing reference frequencies of a target modulation rate for the SSC signal output by the VCO.

55. A spread spectrum clock generator (SSCG) including a phase and frequency detector, a charge pump and filter unit, the modulation controller, an adder, the voltage control oscillator (VCO) and a main divider, the SSCG configured to operate in accordance with the method of claim 47.

56. A spread spectrum clock generator (SSCG) including a phase and frequency detector, a charge pump and filter unit, the modulation controller, an adder, the voltage control oscillator (VCO) and a main divider, the SSCG configured to operate in accordance with the method of claim 51.

57. A phase-locked loop (PLL) including a phase and frequency detector, a charge pump and filter unit, the modulation controller, an adder, the voltage control oscillator (VCO) and a main divider, the PLL configured to operate in accordance with the method of claim 49.

58. A phase-locked loop (PLL) including a phase and frequency detector, a charge pump and filter unit, the modulation controller, an adder, the voltage control oscillator (VCO) and a main divider, the SSCG configured to operate in accordance with the method of claim 52.

59. A spread spectrum clock generator (SSCG) including a phase and frequency detector, a charge pump and filter unit, an adder, the voltage control oscillator (VCO), a main divider and the modulation controller of claim 53.

60. A spread spectrum clock generator (SSCG) including a phase and frequency detector, a charge pump and filter unit, an adder, the voltage control oscillator (VCO), a main divider and the modulation controller of claim 54.

* * * * *